(12) United States Patent
Kim et al.

(10) Patent No.: US 8,022,390 B1
(45) Date of Patent: Sep. 20, 2011

(54) LATERAL CONDUCTION INFRARED PHOTODETECTOR

(75) Inventors: Jin K. Kim, Albuquerque, NM (US); Malcolm S. Carroll, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 989 days.

(21) Appl. No.: 11/840,278

(22) Filed: Aug. 17, 2007

(51) Int. Cl.
*H01L 31/0224* (2006.01)

(52) U.S. Cl. ......... 257/21; 257/12; 257/14; 257/15; 257/22; 257/183; 257/184; 257/196; 257/E31.019; 257/E31.02; 257/E31.036; 257/E31.038; 257/E31.124; 257/E31.126; 250/332

(58) Field of Classification Search ......... 257/28, 257/184–189, 21–27; 250/332
See application file for complete search history.

(56) References Cited

U.S. PATENT DOCUMENTS

| | | | |
|---|---|---|---|
| 4,620,214 A * | 10/1986 | Margalit et al. ......... | 257/21 |
| 4,806,993 A * | 2/1989 | Voisin et al. ......... | 257/22 |
| 4,839,714 A * | 6/1989 | Doehler et al. ......... | 257/28 |
| 4,947,223 A * | 8/1990 | Biefeld et al. ......... | 257/21 |
| 5,306,925 A * | 4/1994 | Abe et al. ......... | 257/21 |
| 5,435,856 A * | 7/1995 | Rouse et al. ......... | 136/225 |
| 5,580,795 A | 12/1996 | Schimert et al. | |
| 5,721,429 A * | 2/1998 | Radford et al. ......... | 250/338.4 |
| 6,316,771 B1 * | 11/2001 | Jurisson et al. ......... | 250/339.01 |
| 6,455,908 B1 * | 9/2002 | Johnson et al. ......... | 257/440 |
| 6,603,184 B2 * | 8/2003 | Lin et al. ......... | 257/458 |
| 2009/0020700 A1 * | 1/2009 | Braunstein et al. ......... | 250/332 |

OTHER PUBLICATIONS

Gail J. Brown, "Type-II InAs/GaInSb Superlattices for Infrared Detection: an Overview", Proc. of SPIE, vol. 5783, 2005, pp. 65-77.
Robert Rehm et al, "InAs/(Galn)Sb short-period superlattices for focal plane arrays", Proc. of SPIE, vol. 5783, 2005, pp. 123-130.
A. Rogalski, "Competitive technologies for third generation infrared photon detectors", Proc. of SPIE, vol. 6206, 2006, pp. 62060S-1-62060S-15.
Sadao Adachi, "Band gaps and refractive indices of AlGaAsSb, GaLnAsSb, and InPAsSb: Key properties for a variety of the 2-4um optoelectronic device applications", J. Appl. Phys., vol. 61, No. 10, May 1987, pp. 4869-4876.

* cited by examiner

*Primary Examiner* — Kiesha Bryant
*Assistant Examiner* — Eric Ward
(74) *Attorney, Agent, or Firm* — John Hohimer (57) ABSTRACT

A photodetector for detecting infrared light in a wavelength range of 3-25 μm is disclosed. The photodetector has a mesa structure formed from semiconductor layers which include a type-II superlattice formed of alternating layers of InAs and $In_xGa_{1-x}Sb$ with $0 \leq x \leq 0.5$. Impurity doped regions are formed on sidewalls of the mesa structure to provide for a lateral conduction of photo-generated carriers which can provide an increased carrier mobility and a reduced surface recombination. An optional bias electrode can be used in the photodetector to control and vary a cut-off wavelength or a depletion width therein. The photodetector can be formed as a single-color or multi-color device, and can also be used to form a focal plane array which is compatible with conventional read-out integrated circuits.

17 Claims, 9 Drawing Sheets

LATERAL CONDUCTION INFRARED PHOTODETECTOR

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to photodetectors and photodetector arrays (also termed focal plane arrays), and in particular to photodetectors and photodetector arrays which include a type-II superlattice region for operation at an infrared wavelength between 3 µm and 25 µm.

BACKGROUND OF THE INVENTION

Conventional mid-infrared focal plane arrays are based on the use of mercury-cadmium-telluride (HgCdTe) photodetectors. Alternatives to HgCdTe photodetectors are being developed which promise operation at higher temperatures with a detectivity comparable to or better than the HgCdTe photodetectors. Among these alternatives are photodetectors formed from antimonide-based type-II superlattices in which there is, at least theoretically, a promise of longer intrinsic carrier lifetimes due to the suppression of Auger recombination. Additionally, the antimonide-based type-II superlattices have a staggered band alignment which allows both the energy band structure and the energy bandgap of the superlattice to be tailored to enhance detector performance for the absorption of infrared light over a wide wavelength range of about 3 to 25 microns (µm) or more. The development of infrared focal plane arrays including devices using antimonide-based type-II superlattice photodetectors has been reviewed in an article by A. Rogalski entitled "Competitive Technologies for Third Generation Infrared Photon Detectors" in *Proceedings of the Society of Photo-Optical Instrumentation Engineers* (*SPIE*), vol. 6206, 62060S (2006). Another review of type-II superlattice photodetectors can be found in an article by G. J. Brown entitled "Type-II InAs/GaInSb Superlattices for Infrared Detection: an Overview" in *Proceedings of the Society of Photo-Optical Instrumentation Engineers* (*SPIE*), vol. 5783, pp. 65-77 (2005).

The present invention provides an advance over the art in the development of antimonide-based type-II superlattice photodetectors and photodetector arrays by providing devices which have a lateral conduction structure comprising a semiconductor p-n or p-i-n junction which is formed across the width of the photodetector instead of a more conventional vertical conduction structure in which the semiconductor junction is formed in an epitaxial growth direction (i.e. a vertical direction). The lateral conduction structure formed in the photodetectors of the present invention allows the semiconductor junction to be sandwiched between upper and lower cladding layers which passivates the semiconductor junction. This is advantageous to reduce surface recombination and thereby improve device performance.

Embodiments of the present invention can be used as multi-color photodetectors and photodetector arrays to detect light in two or more different wavelength bands. The use of a lateral conduction structure allows the different wavelength bands to be sensed simultaneously or independently. A bias electrode can also be provided in these embodiments of the present invention to vary a cut-off wavelength, or to control a depletion region width in the photodetectors and photodetector arrays.

These and other advantages of the present invention will become evident to those skilled in the art.

SUMMARY OF THE INVENTION

The present invention relates to a photodetector which comprises a semiconductor substrate with a plurality of semiconductor layers epitaxially grown on the semiconductor substrate including a lower cladding layer, a type-II superlattice region, and an upper cladding layer. The type-II superlattice region can comprise a not-intentionally-doped type-II superlattice. A mesa structure is formed from the plurality of semiconductor layers, with the mesa structure having a plurality of sidewalls. An n-type-doped region extends laterally into the type-II superlattice region from a first sidewall of the mesa structure; and a p-type-doped region extends laterally into the type-II superlattice region from a second sidewall of the mesa structure. The first and second sidewalls are located on opposite sides of the mesa structure. The n-type-doped region and the p-type-doped region together with the type-II superlattice region forms a semiconductor p-n or p-i-n junction extending between the first and second sidewalls. This semiconductor p-n or p-i-n junction is a lateral conduction structure which can be used to detect incident light in a predetermined wavelength band in the infrared region of the spectrum. A first electrode is deposited on the first sidewall; and a second electrode is deposited on the second sidewall, with the first and second electrodes providing electrical connections to the photodetector. One of the first and second electrodes can extend over a top surface of the mesa structure.

The semiconductor substrate can comprise a gallium antimonide (GaSb) substrate or alternately gallium arsenide (GaAs). The lower and upper cladding layers can comprise III-V compound semiconductors such as GaSb, indium arsenide (InAs), aluminum gallium antimonide (AlGaSb) or aluminum gallium arsenide antimonide (AlGaAsSb) which have a bandgap energy which is larger than the bandgap energy of the type-II superlattice region. The type-II superlattice region can comprise a plurality of alternating layers of two different III-V compound semiconductors which can be indium arsenide (InAs) and indium gallium antimonide ($In_xGa_{1-x}Sb$) with an indium content x in the range $0 \leq x \leq 0.5$.

In some embodiments of the present invention, the type-II superlattice region can be formed during epitaxial growth to detect light at different wavelength bands. This can be done by epitaxially growing the type-II superlattice region as a plurality of stacked regions each having a different bandgap energy corresponding to a different cut-off wavelength to detect light at a different wavelength band. As an example, the type-II superlattice region can comprise a first-grown type-II superlattice region having a first bandgap energy to detect light at a first wavelength band, and a second-grown type-II superlattice region having a second bandgap energy to detect light at a second wavelength band which is different from the first wavelength band. In this example, the first and second electrodes can provide an electrical connection to the first-grown type-II superlattice region. For the second-grown type-II superlattice region, another n-type-doped region can be provided which extends laterally into the second-grown type-II superlattice region from a third sidewall of the mesa structure, and another p-type-doped region can be provided which extends laterally into the second-grown type-II superlattice region from a fourth sidewall of the mesa, with the fourth sidewall being located opposite the third sidewall. To provide an electrical connection to the second-grown type-II superlattice region, a third electrode can be deposited on the third sidewall, and a fourth electrode can be deposited on the fourth sidewall.

The present invention further relates to a photodetector for detecting infrared light which comprises a semiconductor substrate and a plurality of semiconductor layers which are epitaxially grown on the semiconductor substrate and which include a lower cladding layer, a type-II superlattice region, and an upper cladding layer. A mesa structure is formed from the plurality of semiconductor layers, with the mesa structure having a plurality of outer sidewalls, and with a central portion of the mesa structure being etched downward at least partway through the type-II superlattice region to form an inner sidewall of the mesa structure. An electrically-insulating layer is provided over a top surface of the mesa structure. A first impurity-doped region extends into the mesa structure from the inner sidewall of the mesa structure; and a second impurity-doped region extends into the mesa structure from one or more of the outer sidewalls of the mesa structure. The first impurity-doped region and the second impurity-doped region can be oppositely doped (e.g. an n-type-doped first impurity-doped region and a p-type-doped second impurity-doped region, or vice versa). A first electrode is deposited over the inner sidewall of the mesa structure and extends over the top surface of the mesa structure above the electrically-insulating layer; and a second electrode is deposited over the second impurity-doped region. The second electrode can be in electrical contact with the semiconductor substrate.

The semiconductor substrate can comprise a GaSb substrate, or a GaAs substrate. The lower cladding layer and the upper cladding layer can each have a bandgap energy which is larger than the bandgap energy of the not-intentionally-doped superlattice region. The type-II superlattice region can comprise a not-intentionally-doped type-II superlattice. The type-II superlattice region can be formed from a plurality of alternating layers of InAs and $In_xGa_{1-x}Sb$ with $0 \leq x \leq 0.5$.

The inner sidewall of the mesa structure can be tapered inward with distance from the top surface of the mesa structure. This can be done with the central portion of the mesa structure having a conical shape, or a pyramidal shape. The outer sidewalls of the mesa structure can be tapered outward with distance from the top surface of the mesa structure.

The present invention also relates to a two-dimensional (2-D) array of photodetectors (also termed a focal plane array) for detecting infrared light. The 2-D array of photodetectors comprises a III-V compound semiconductor substrate with a plurality of III-V compound semiconductor layers being epitaxially grown on the III-V compound semiconductor substrate including a type-II superlattice region formed from alternating layers of InAs and $In_xGa_{1-x}Sb$ with an indium content given by $0 \leq x \leq 0.5$. The plurality of semiconductor layers can also include a lower cladding layer located beneath the type-II superlattice region, and an upper cladding layer located above the type-II superlattice region.

A mesa structure is formed from the plurality of III-V compound semiconductor layers at the location of each photodetector in the 2-D array of photodetectors, with the mesa structure having at least one outer sidewall, and with a central portion of the mesa structure being etched downward at least partially through the type-II superlattice region to form an inner sidewall of the mesa structure. An electrically-insulating layer is provided over a top surface of each mesa structure (i.e. overtop each photodetector in the 2-D array). A first impurity-doped region extends into each mesa structure from the inner sidewall thereof; and a second impurity-doped region extends into each mesa structure from the at least one outer sidewall thereof. The first impurity-doped region and the second impurity-doped region can be oppositely doped to form a semiconductor p-n or p-i-n junction in combination with the type-II superlattice region which can, in some cases, include a not-intentionally-doped type-II superlattice. The III-V compound semiconductor substrate can have a thickness of 200 microns or less so that infrared light can be transmitted through the substrate and absorbed in the type-II superlattice region to generate an electrical output signal across the semiconductor p-n or p-i-n junction which forms a lateral conduction structure.

Electrodes are provided to contact the semiconductor p-n or p-i-n junction. The electrodes can include a first electrode deposited over the inner sidewall of each mesa structure and extending overtop the mesa structure above the electrically-insulating layer. A second electrode can be deposited over the second impurity-doped region of each mesa structure. The second electrode of each mesa structure can be electrically connected to the GaSb substrate to provide a common electrical connection for the 2-D array of photodetectors.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
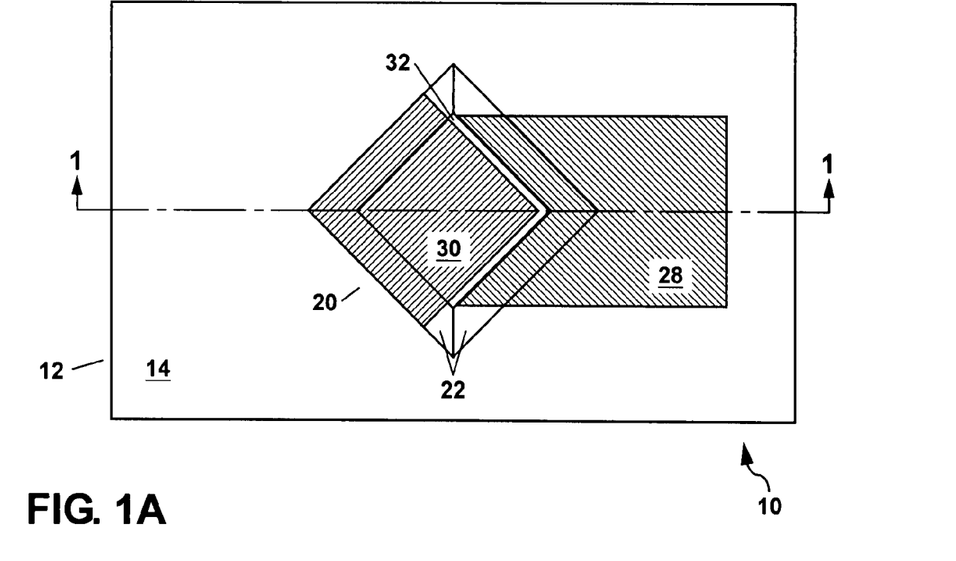
FIG. 1A shows a schematic plan view of a first example of a photodetector according to the present invention.
Figure 1B:
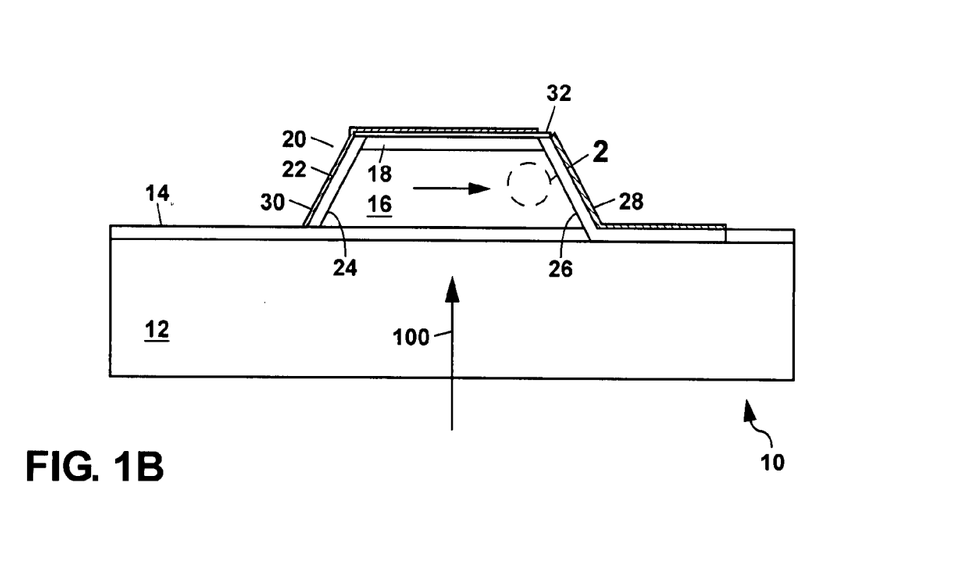
FIG. 1B shows a schematic cross-section view of the device of FIG. 1A along the section line 1-1 in FIG. 1A.

FIGS. 1A and 1B show schematic plan and cross-section views, respectively, of a first example of a photodetector 10 of the present invention. The photodetector 10 comprises a III-V compound semiconductor substrate 12 having a plurality of semiconductor layers epitaxially grown thereon, including a lower cladding layer 14, a type-II superlattice region 16, and an upper cladding layer 18. After epitaxial growth of the semiconductor layers, a mesa structure 20 can be formed by etching down through the semiconductor layers at least to the lower cladding layer 14. The mesa structure 20 defines the size and shape of the photodetector 10 as shown in FIGS. 1A and 1B.

The term "mesa structure" as used herein refers to a structure which is formed by etching down into a plurality of epitaxially-grown semiconductor layers to form one or more sidewalls 22 which can be vertical, or which are preferably sloped outward towards a base of the structure. The term "mesa structure" can also refer to a frustrum formed from a plurality of epitaxially-grown semiconductor layers by etching.

Although a single photodetector 10 is shown in FIGS. 1A and 1B, those skilled in the art will understand that a two-dimensional (2-D) array of photodetectors 10 (i.e. a focal plane array) can be formed on the same substrate 12 (see FIGS. 6A and 6B). Such a focal plane array, which can include up to one million or more individual photodetectors 10, is useful for imaging purposes. The lateral dimensions of each photodetector 10 can range, for example, from about 10 microns (μm) up to about 1 millimeter (mm).

In the example of FIGS. 1A and 1B, an n-type-doped region 24 is formed to extend laterally into the superlattice region 16 from one or more sidewalls 22 of the mesa structure 20; and a p-type-doped region 26 extends into the superlattice region 16 from on one or more sidewalls 22 opposite the n-type-doped region 24. Generally, a majority or all of the superlattice region 16 will be not-intentionally-doped with a residual carrier concentration on the order of $10^{15}$-$10^{16}$ cm$^{-3}$ or less. In the example of FIGS. 1A and 1B, the n-type-doped region 24 extends inward into the superlattice region 16 from two adjacent sidewalls 22; and the p-type-doped region 26 is formed inward from the remaining two sidewalls 22. The n-type-doped and p-type-doped regions 24 and 26 are also referred to herein as impurity-doped regions since these regions 24 and 26 have been doped with an impurity dopant to provide an n-type or p-type dopant concentration of about $10^{17}$-$10^{18}$ cm$^{-3}$. This doping forms a semiconductor p-i-n junction across the width of the not-intentionally-doped superlattice region 16, with interfaces of the n-type-doped and p-type-doped regions 24 and 26 with the not-intentionally-doped superlattice region 16 forming p and n sides of the p-i-n junction, and with the not-intentionally-doped superlattice region 16 forming an intrinsic (i) portion of the p-i-n junction. The not-intentionally-doped superlattice region 16 forms a depletion region which extends across a majority of the width of the photodetector 10. In other embodiments of the present invention when the superlattice region 16 is doped n-type or p-type (e.g. to about 5×$10^{16}$ cm$^{-3}$ or more), a semiconductor p-n junction will be formed across the width of the superlattice region 16 by the n-type-doped and p-type-doped regions 24 and 26.

As incident light 100 is transmitted through the semiconductor substrate 12 and enters the superlattice region 16, the light 100 is absorbed and generates carriers (i.e. electrons and holes) which flow laterally towards electrodes 28 and 30 formed on the n-type-doped region 24 and on the p-type-doped region 26, respectively, by a built-in electric field across the depletion region. The electrons flow towards the p-doped-region 26 and electrode 28 as indicated by the horizontal arrow in FIG. 1B; and the holes flow in the opposite direction towards the n-type-doped region 24 and electrode 30. Since there are no exposed interfaces in the semiconductor p-n or p-i-n junction, surface recombination can be reduced in the lateral conduction structure for the photodetector 10 of the present invention.

In the example of FIGS. 1A and 1B, the p-type-doped region 26 can extend down through the lower cladding layer 14 which is otherwise undoped (i.e. not intentionally doped). This allows the electrode 28 to form an electrical connection to the substrate 12 which can also be p-type-doped to about $10^{18}$ cm$^{-3}$. Alternately, when the mesa structure 20 is etched completely through the lower cladding layer 14, a part of the electrode 28 can be deposited directly on the p-type-doped substrate 12. The electrode 30 in FIGS. 1A and 1B extends overtop the mesa structure 20 and can be electrically isolated from the underlying upper cladding layer 18 by an intervening electrically-insulating layer 32. Extending the electrode 30 overtop the mesa structure 20 is useful to connect external wiring to this side of the photodetector 10, and also is advantageous to reflect any unabsorbed portion of the light 100 back through the type-II superlattice region 16 a second time, thereby approximately increasing the responsivity and quantum efficiency of the photodetector 10. Each electrode 28 and 30 can comprise a Ti/Pt/Au electrode formed by depositing layers of titanium, platinum and gold to an overall layer thickness of about 200 nanometers using evaporation or sputtering.

To form an infrared photodetector 10 capable of detecting light 100 in a wavelength band located in the wavelength range of 3-25 μm, the semiconductor substrate 12 can comprise a gallium antimonide (GaSb) substrate 12, or alternately a gallium arsenide (GaAs) substrate. The substrate 12 can be undoped (i.e. not-intentionally-doped), or alternately can be doped p-type using a p-type dopant such as zinc (Zn) or beryllium (Be). Other p-type dopants for III-V compound semiconductors that can be used for the substrate 12, and for the p-type-doped region 26, include magnesium (Mg) and cadmium (Cd). In other embodiments of the present invention, an n-type-doped substrate 12 can be used. N-type dopants for such an n-type-doped substrate 12, and for the n-type-doped region 24, include silicon (Si), germanium (Ge), tin (Sn), sulfur (S), selenium (Se) and tellurium (Te). Generally, the substrate 12 will be procured commercially, with the exact p-type and n-type dopant for the substrate 12 being what is readily available in the marketplace. The exact n-type and p-type dopants used will depend upon a number of factors including the existence of trap states produced by the dopant, and ion implantation and thermal diffusivity characteristics of the n-type and p-type dopants.

The substrate 12 can have a thickness of, for example, 500 μm, and can be subsequently thinned to a thickness of 200 μm or less after fabrication of the photodetector 10. In some instances, the substrate 12 can be thinned down to a thickness of 20-25 μm. Thinning of the semiconductor substrate 12, which can be done by a combination of polishing and etching to remove mechanical damage caused by the polishing, can increase the transmission of the light 100 through the semiconductor substrate 12 to the superlattice region 16 to improve the responsivity of the photodetector 10.

The plurality of semiconductor layers which will generally be III-V compound semiconductor layers can be epitaxially grown on the substrate 12 by molecular beam epitaxy (MBE) at a growth temperature of about 400° C., for example. To initiate the growth of the semiconductor layers, the lower cladding layer 14 can be grown on the substrate 12 to a thickness of, for example, 0.5 µm. The lower cladding layer 14 can comprise GaSb or alternately aluminum gallium antimonide (AlGaSb) or aluminum gallium arsenide antimonide (AlGaAsSb). Preferably, the lower cladding layer 14 will have a semiconductor alloy composition which is substantially lattice matched to the substrate 12. As an example, an $Al_{0.5}Ga_{0.5}As_{0.04}Sb_{0.96}$ lower cladding layer 14 can be epitaxially grown on a GaSb substrate 12. The lower cladding layer 14 preferably has an energy bandgap which is larger than the energy bandgap of the superlattice region 16 and can be grown undoped (i.e. not-intentionally-doped). This provides a barrier to vertical transport of carriers generated in the not-intentionally-doped portion of the superlattice region 16 due to the absorption of light 100 therein. The bandgap energy of GaSb is 0.72 electron volts (eV), and that of AlGaAsSb lattice-matched to the GaSb substrate 12 is about 1.3 eV.

The type-II superlattice region 16 is epitaxially grown above the lower cladding layer 14. In the example of FIGS. 1A and 1B, the entire type-II superlattice region 16 can be grown not-intentionally-doped. In other embodiments of the present invention, portions of the type-II superlattice region can be epitaxially grown with n-type doping or with p-type doping to enhance lateral carrier conduction and to further suppress any vertical carrier conduction (see FIG. 6).

Figure 2:
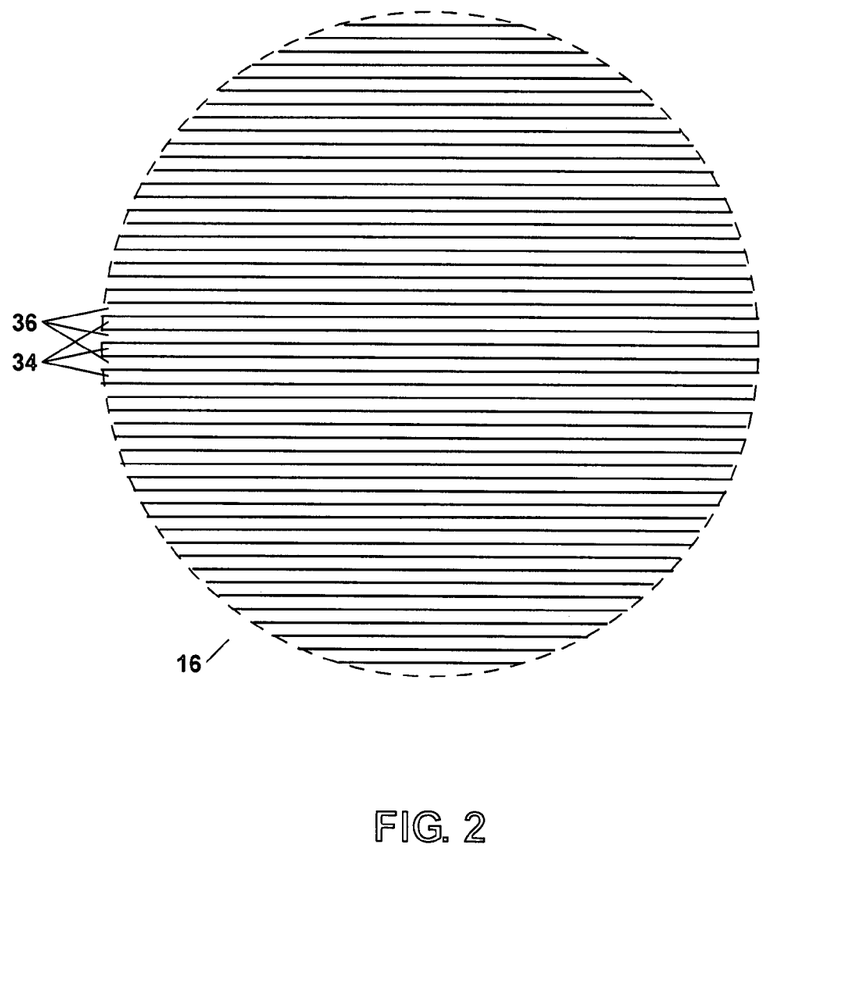
FIG. 2 shows an enlarged partial view of a superlattice region in the device of FIGS. 1A and 1B.

The superlattice region 16 in FIG. 2 comprises a plurality of alternating layers of the III-V compound semiconductors InAs 34 and indium gallium antimonide ($In_xGa_{1-x}Sb$) 36 with an indium content x being given by $0 \leq x \leq 0.5$, and with a thickness of each layer 34 and 36 generally being on the order of 15 monolayers (i.e. about 9 nanometers) or less. This can be seen from the enlarged partial cross-section view of FIG. 2. Although the layers 34 and 36 in FIG. 2 are strained due to a lattice constant of each layer 34 and 36 which is different from the lattice constant of the GaAs or GaSb substrate 12, this strain can be accommodated due to the very small thickness of each layer 34 and 36. Altogether up to several hundred or more periods of alternating InAs and $In_xGa_{1-x}Sb$ layers 34 and 36 can be epitaxially grown to form the type-II superlattice region 16, with each period comprising one InAs layer 34 and an adjacent $In_xGa_{1-x}Sb$ layer 36. An overall thickness of the superlattice region 16 can be up to about 20 µm or more, with the exact thickness depending upon a wavelength of the light 100 to be detected. The term "$In_xGa_{1-x}Sb$" as used herein is intended to include ternary alloys when $x>0$, and is also intended to include the binary alloy GaSb when $x=0$.

A type-II energy band alignment is present at a heterointerface between each InAs layer 34 and an adjacent $In_xGa_{1-x}Sb$ layer 36. The type-II energy band alignment is characterized by a staggered energy band alignment with the bottom of the conduction band of the InAs layer 34 being below the top of the valence band of the adjacent $In_xGa_{1-x}Sb$ layer 36. This results in a superlattice energy band gap due to the separation between the confined hole states in the valence band of each $In_xGa_{1-x}Sb$ layer 36 and the confined electron states in the conduction band of each InAs layer 34. This forms a direct energy bandgap which can be adjusted by varying the widths of the individual layers 34 and 36, and also by varying the indium content x in the $In_xGa_{1-x}Sb$ layer 36.

By adjusting the direct energy bandgap of the superlattice region 16 by controlling the thickness of the layers 34 and 36 and/or the indium content x of the $In_xGa_{1-x}Sb$ layer 36, the photodetector 10 can be tailored to detect infrared light 100 over a predetermined wavelength band which can be in the range of 3-25 µm. Infrared wavelength bands of interest for the photodetector 10 can include a second atmospheric transmission window at 3-5 µm, and a third atmospheric transmission window at 8-12 µm. The exact thickness of the layers 34 and 36 and the indium content x of the layers 36 will depend upon a particular wavelength band with which the photodetector 10 is to be used and can be determined from practice of the present invention, or by modeling of the superlattice region 16 using commercial bandstructure modeling software (e.g. NEXTNANO3). The thicknesses of the layers 34 and 36 need not be the same. Increasing the period of the superlattice region 16 will increase the wavelength of the infrared light 100 which can be detected, with a minimum bandgap energy being calculated to occur when the thickness of the InAs layers 34 is approximately twice the thickness of the $In_xGa_{1-x}Sb$ layers 36 for $x=0$.

The type-II superlattice region 16 is strained due to biaxial tension in the InAs layers 34 and biaxial compression ion the $In_xGa_{1-x}Sb$ layers 36. This strain decreases the superlattice energy band gap for given layer thicknesses of the InAs and $In_xGa_{1-x}Sb$ layers 34 and 36, with the biaxial tension in the InAs layers 34 lowering the conduction band energy, and with the biaxial compression in the $In_xGa_{1-x}Sb$ layers 36 raising the energy of the heavy hole valence band. A smaller layer thickness for the $In_xGa_{1-x}Sb$ layers can be used if the indium content x therein is increased, and this can be used to increase an absorption coefficient for infrared light 100 in the superlattice region 16. An ability to control the absorption wavelength using both the layer thicknesses of the InAs and $In_xGa_{1-x}Sb$ layers 34 and 36, and also by varying the indium content x in the layers 36, provides considerable flexibility in adjusting these parameters while maintaining a predetermined absorption wavelength for the detection of light 100 at infrared wavelengths. The energy bandgap of the type-II superlattice region 16 used in the photodetector 10 of the present invention can be varied over the range of 0-400 millielectron volts (meV).

A lateral conduction of a photocurrent due to the carriers generated in the InAs and $In_xGa_{1-x}Sb$ layers 34 and 36 when infrared light 100 is absorbed therein is advantageous since the type-II superlattice layers 34 and 36 have significantly better lateral current conduction properties than vertical current conduction properties. This is due to a higher carrier mobility in the lateral (in-plane) direction. The higher in-plane carrier mobility also ensures that photo-generated carriers have a faster transit time to the electrodes 28 and 30 so that they can contribute to an electrical output signal from the photodetector 10 before any parasitic carrier recombination can occur to generate noise in the electrical output signal.

Returning to FIGS. 1A and 1B, an upper cladding layer 18 can be epitaxially grown above the superlattice region 16 using MBE. The upper cladding layer 18 can comprise InAs, GaSb, AlGaSb or AlGaAsSb. Like the lower cladding layer 14, the upper cladding layer 18 preferably has an energy bandgap which is larger than the energy bandgap of the type-II superlattice region 16 to provide a barrier to carriers generated in the type-II superlattice region 16 by the absorption of infrared light 100 therein. This, together with the built-in electric field across the depletion region of the semiconductor junction, forces any generated carriers to flow laterally to the n-type-doped and p-type-doped regions 24 and 26 where they are collected to provide an electrical output signal at the electrodes 28 and 30. The upper cladding layer 18, which can have a thickness of, for example, 0.5 µm, is not intentionally doped during epitaxial growth and preferably is grown with a residual doping level below $10^{16}$ cm$^{-3}$.

After epitaxial growth of the various semiconductor layers shown in FIGS. 1A and 1B, an electrically-insulating layer 32 can be blanket deposited over the semiconductor substrate 12. The electrically-insulating layer 32 can be, for example, 0.2-1 µm thick and can comprise an electrically-insulating material such as silicon dioxide, silicon nitride, polyimide, spin-on glass, etc. The electrically-insulating layer 32 can be blanket deposited by plasma-enhanced chemical vapor deposition or by spin coating, and then etched to remove unwanted portions of the deposited electrically-insulating material.

A photolithographically-defined etch mask can then be provided over the III-V compound semiconductor substrate 12 in preparation for etching the mesa structure 20. The mesa structure 20 can be etched, for example, using chemically-assisted ion beam etching. The mesa structure 20 can comprise a frustrum shape with slanted sidewalls 22 as shown in FIG. 1A or 1B. Alternately, the mesa structure 20 can have sidewalls 22 which are substantially perpendicular to the substrate 12. Outward sloped sidewalls 22 are generally to be preferred since this facilitates forming the impurity-doped regions 24 and 26 which extend into the type-II superlattice region 16 from the sidewalls 22. The etched mesa structure 20 can be formed down to or partway through the lower cladding layer 14.

After etching the mesa structure 20, the etch mask can be removed, or left in place for use in forming the impurity-doped regions 24 and 26. The impurity-doped regions 24 and 26 can be formed by ion implantation with the semiconductor substrate 12 being tilted at an angle (e.g. 10°-45°) to expose certain of the sidewalls 22 to an incident ion beam while protecting other of the sidewalls 22 from being ion implanted by the incident ion beam. The exact tilt angle for each ion implantation step will depend upon a slope of the sidewalls 22.

A first ion implantation step can be performed to implant n-type ions to form the n-type-doped region 24; and a second ion implantation step can be performed to implant p-type ions to form the p-type-doped region 26. When the substrate 12 is p-type doped, the p-type ions can also be implanted into the lower cladding layer 14 as shown in FIG. 1B to provide an electrical connection to the p-type-doped substrate 12. Alternately, when the substrate 12 is n-type doped, a portion of the lower cladding layer 14 adjacent to the n-type-doped region 24 can be n-type doped to provide an electrical connection to the n-type-doped substrate 12. The n-type ions can be selected from the group consisting of Si, Ge, Sn, S, Se or Te ions; and the p-type ions can be selected from the group consisting of Be, Mg, Zn or Cd ions. Each ion implantation step can deposit ions, for example, at an energy of 130 keV and a dosage of $10^{13}$ cm$^{-2}$. The impurity-doped regions 24 and 26 can extend laterally into the type-II superlattice region 16 up to a few microns.

In some instances, a thermal diffusion step or a shallow ion implantation followed by a thermal diffusion step can be used to form the impurity-doped regions 24 and 26. Thermal diffusion can be performed, for example, at a temperature of 450° C.

After forming the impurity-doped regions 24 and 26, the electrodes 28 and 30 can be deposited to form electrical connections to the photodetector 10. The electrodes 28 and 30 can comprise layers of titanium, platinum and gold deposited by evaporation or sputtering to an overall thickness of about 200 nm.

The semiconductor substrate 12 can then be optionally thinned to improve the transmission of infrared light 100 through the substrate 12. When a GaSb substrate 12 is used to detect infrared light in at wavelengths in the range of 3-25 µm, the GaSb substrate 12 can be thinned to a thickness of less than 200 µm, and generally about 20-25 µm. Thinning of the substrate 12 can be performed by a combination of mechanical polishing and wet etching. An anti-reflection coating (see FIG. 6B) can then be optionally deposited over the lower surface of the semiconductor substrate 12 to reduce the reflection of the infrared light 100 from this surface due to the relatively high index of refraction of the semiconductor substrate 12. The photodetector 10 in the example of FIGS. 1A and 1B and the other examples of the photodetector 10 described hereinafter can be operated a temperature which is generally in the range of about 100-200° K or higher.

Figure 3A:
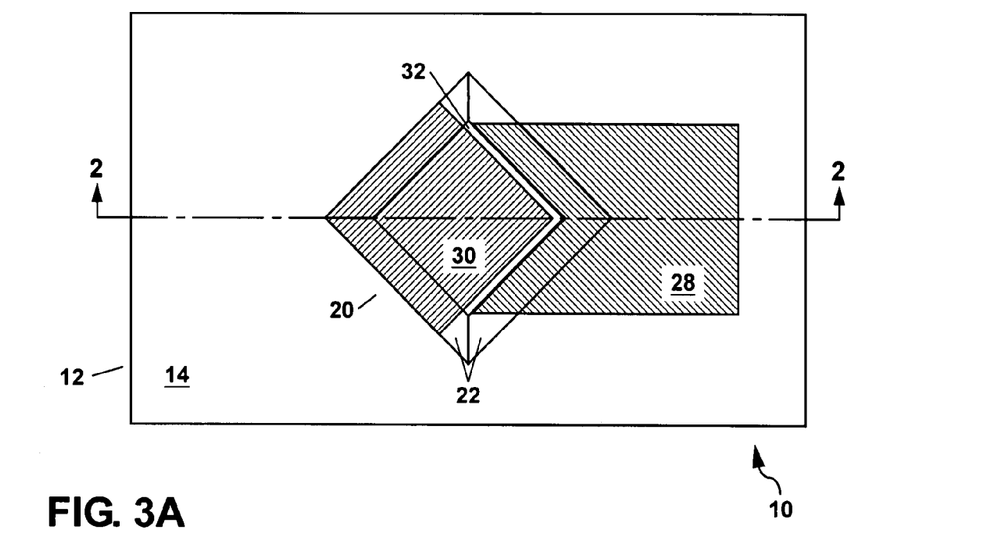
FIG. 3A shows a schematic plan view of a second example of a photodetector according to the present invention.
Figure 3B:
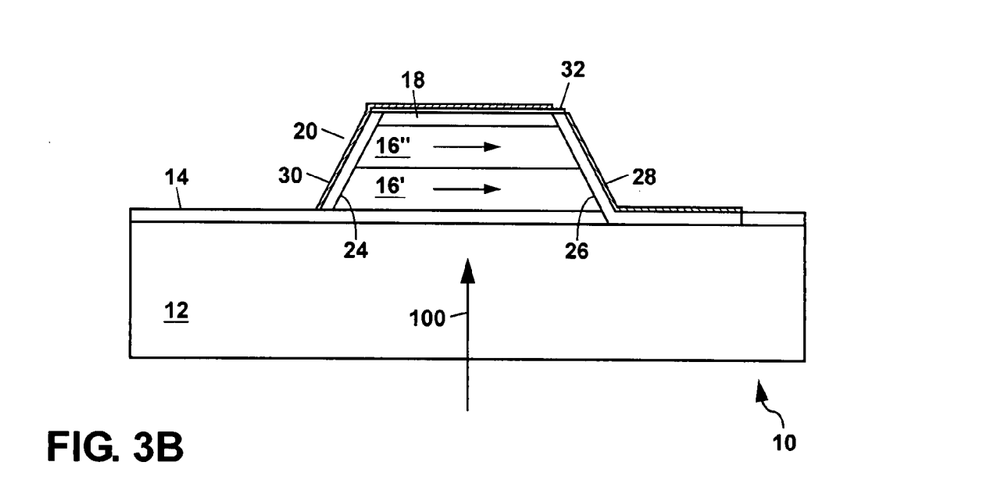
FIG. 3B shows a schematic cross-section view of the device of FIG. 3A along the section line 2-2 in FIG. 3A.

FIGS. 3A and 3B show a schematic plan view and a schematic cross-section view, respectively, of a second example of a photodetector 10 formed according to the present invention. The photodetector 10 of FIGS. 3A and 3B can be formed similarly to the first example in FIGS. 1A and 1B except that the type-II superlattice region 16 is divided into two different regions designated 16' and 16" having two different bandgap energies to detect light 100 at two different wavelength bands. For example, a first-grown superlattice region 16' comprising alternating InAs and In$_x$Ga$_{1-x}$Sb layers 34 and 36, respectively, can be tailored in terms of layer thickness and indium content x to detect infrared light 100 in a wavelength band at 3-5 µm. This can be done with a bandgap energy of the first-grown superlattice region 16' being about 250 meV. The InAs and In$_x$Ga$_{1-x}$Sb layers 34 and 36 in a second-grown superlattice region 16" can then be tailored to detect infrared light 100 in another wavelength band at of 8-12 µm by epitaxially growing the superlattice region 16" with a bandgap energy of about 100 meV.

Photo-generated electrons in each superlattice region 16' and 16" provide a lateral photocurrent flow towards the electrode 28 in FIG. 3B as indicated by the horizontal arrows. Photo-generated holes provide another lateral photocurrent flow in the opposite direction towards the electrode 30. The photocurrents produce an electrical output signal at the electrodes 28 and 30 which contains information about the light 100 detected in the two different wavelength bands at 3-5 µm and 8-12 µm, thereby forming a multi-color photodetector 10. Since the photocurrents from each superlattice region 16' and 16" flow in parallel, there is no need for photocurrent matching between the two superlattice regions 16' and 16" as would be required if the photocurrent were to flow vertically in series through the two superlattice regions 16' and 16".

Those skilled in the art will understand that additional superlattice regions with yet different bandgap energies can be epitaxially grown to further increase the number of wavelength bands which can be detected with the photodetector 10 of the present invention. Varying the bandgap energy along an epitaxial growth direction of the superlattice region 16 is also useful to broaden the range of wavelengths of light 100 which can be detected and thereby form a broad-band photodetector 10.

Figure 4A:
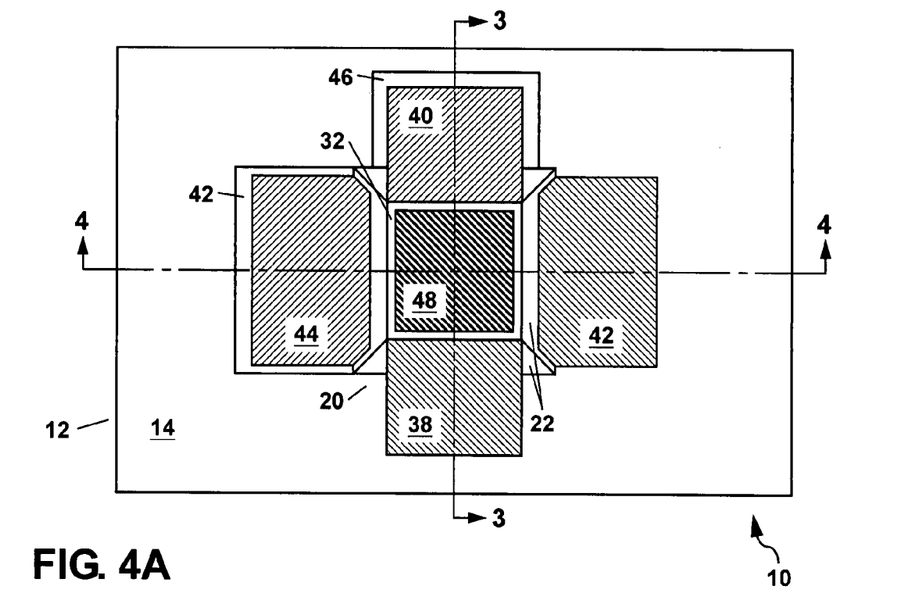
FIG. 4A shows a schematic plan view of a third example of a photodetector according to the present invention.
Figure 4B:
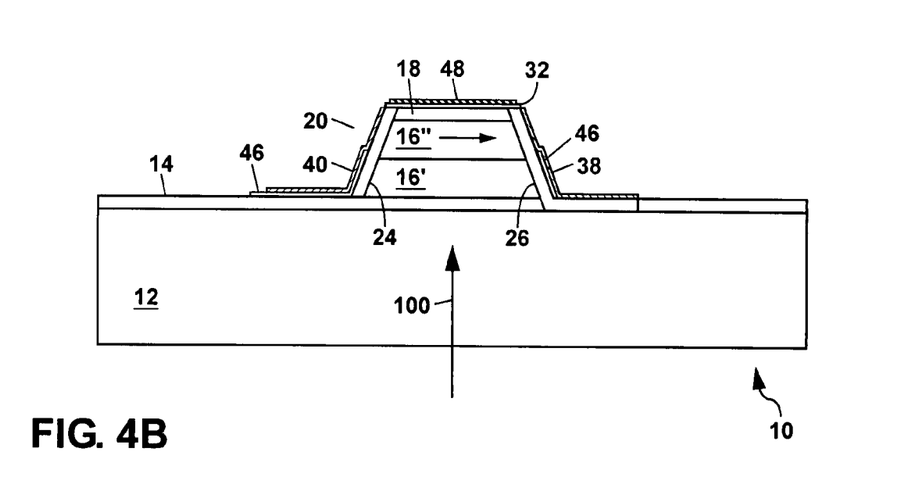
FIG. 4B shows a schematic cross-section view of the device of FIG. 4A along the section line 3-3 in FIG. 4A.
Figure 4C:
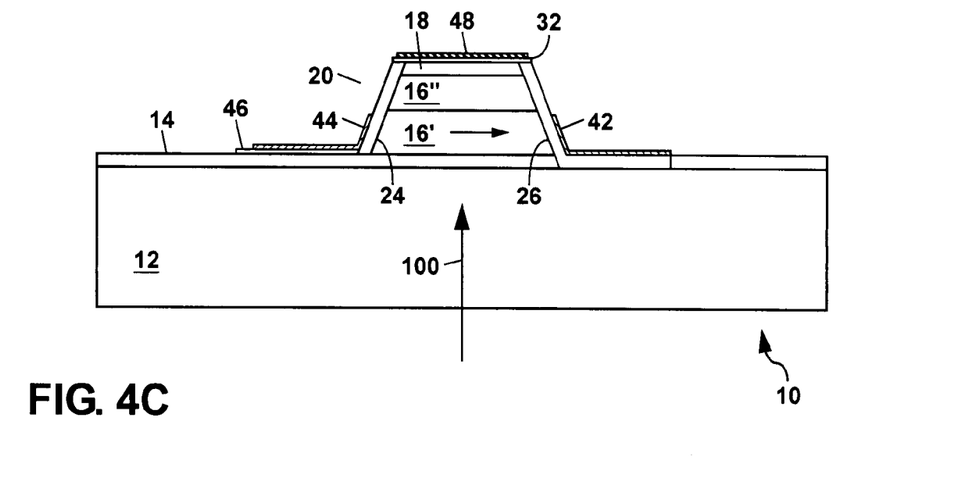
FIG. 4C shows a schematic cross-section view of the device of FIG. 4A along the section line 4-4 in FIG. 4A.

FIGS. 4A-4C show a schematic plan view of a third example of the photodetector 10 of the present invention. This example can be formed similar to the second example in FIGS. 3A and 3B with two different type-II superlattice regions 16' and 16" to detect incident light 100 at two different wavelength bands. In the third example of FIGS. 4A-4C, however, the two different superlattice regions 16' and 16" are separately contacted to provide separate electrical output signals for the detected light in the two different wavelength bands. This separate contacting of the two regions 16' and 16" can be seen in the schematic cross-section view of FIG. 4B taken along the section line 3-3 in FIG. 4A, and in the schematic cross-section view of FIG. 4C taken along the section line 4-4 in FIG. 4A. Incident light 100 absorbed in the superlattice region 16" generates electron and hole photocurrents which move laterally toward a first set of electrodes 38 and 40 in the superlattice region 16" as shown in FIG. 4B. Note that the single-headed arrow in FIG. 4B indicates the direction of electron photocurrent flow, with the hole photocurrent flow being oppositely directed. Similarly, the absorption of incident light 100 in the superlattice region 16' generates additional electron and hole photocurrent signals which move laterally towards a second set of electrodes 42 and 44 as shown in FIG. 4C. By using two different sets of electrodes 38, 40 and 42, 44 in the multi-color photodetector 10 of FIGS. 4A-4C, electrical output signals corresponding to the two different detected wavelength bands of the light 100 can be separately sensed, analyzed, recorded and displayed. When a 2-D array of photodetectors are formed based on the device 10 of FIGS. 4A-4C, this ability to separately sense, analyze, record and display multiple wavelength bands of light 100 is useful to provide information about a scene of view which is beyond that which would be possible with the multi-color device 10 of FIGS. 3A and 3B.

In FIGS. 4A-4C, one electrode in each set (i.e. electrodes 38 and 42) can be electrically connected to the semiconductor substrate 12 through the impurity-doped region 26, while the other electrode in each set (i.e. electrodes 40 and 44) is electrically isolated from the substrate 12 by an intervening electrical insulator 46 located therebeneath. The electrical insulator 46 can be formed of the same material as the electrically-insulating layer 32, and can be deposited at the same time.

The photodetector 10 in FIGS. 4A-4C allows two different wavelength bands of the incident light 100 to be separately detected, with each wavelength band providing an electrical output signal to a different set of electrodes. This allows a simultaneous detection of the light 100 at the two different wavelength bands, or alternately allows each wavelength band to be selected independently. Generally, incident light 100 at shorter wavelengths (e.g. 3-5 µm) will be detected in the first-grown superlattice region 16'; and light 100 at longer wavelengths (e.g. 8-12 µm) will be detected in the second-grown superlattice region 16".

By providing the electrodes 38, 40, 42 and 44 on the sidewalls 22 of the mesa structure 20, each superlattice region 16' and 16" can be independently optimized in terms of semiconductor alloy composition and layer thicknesses for detecting light in a predetermined wavelength band since the photocurrents in each region 16' and 16" flow laterally and in parallel. This is in contrast to conventional multi-color photodetectors which require matching of vertically-flowing photocurrents in each stage since these photocurrents flow in series. Matching of the vertically-flowing photocurrents in the conventional multi-color photodetectors requires that compromises be made which can affect the sensitivity or detectivity in one of the stages.

Another electrode 48 can be optionally provided overtop the mesa structure 20 as shown in FIGS. 4A-4C. The electrode 48 is used to provide an electrical input to the photodetector 10 to tune the bandgap energy of the two superlattice regions 16' and 16", or to control the width of the depletion region therein. Tuning of the bandgap energy can be performed by applying a forward-bias voltage between the electrode 48 and the semiconductor substrate 12. This changes an absorption cut-off wavelength of each superlattice region 16' and 16" due to a quantum-confined Stark effect. Tuning of the depletion region width of each superlattice region 16' and 16" can be performed by applying a reverse-bias voltage between the electrode 48 and the semiconductor substrate 12. Additionally, the electrode 48 serves as a reflector to reflect any unabsorbed portion of the light 100 back through the photodetector 10 a second time to increase the detectivity.

Figure 5A:
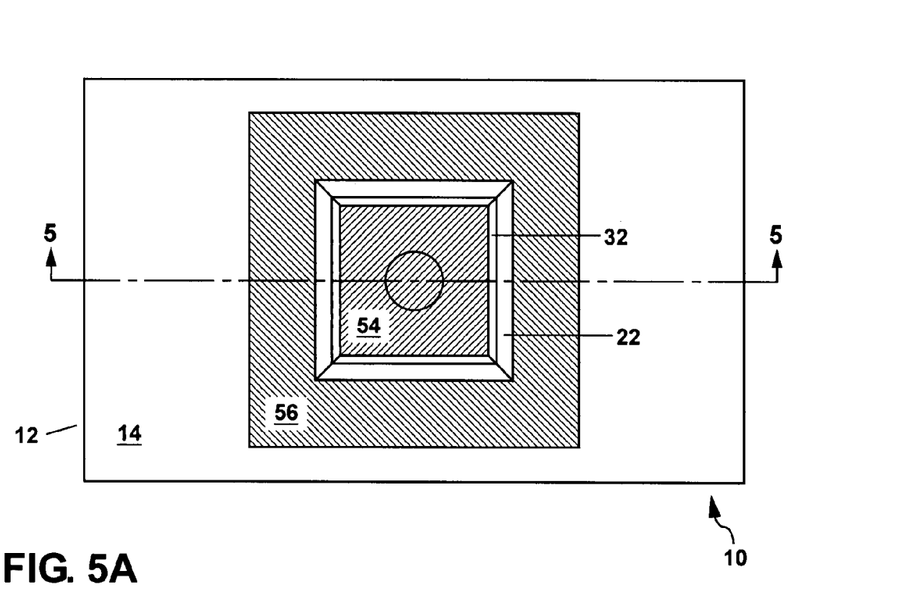
FIG. 5A shows a schematic plan view of a fourth example of a photodetector according to the present invention.
Figure 5B:
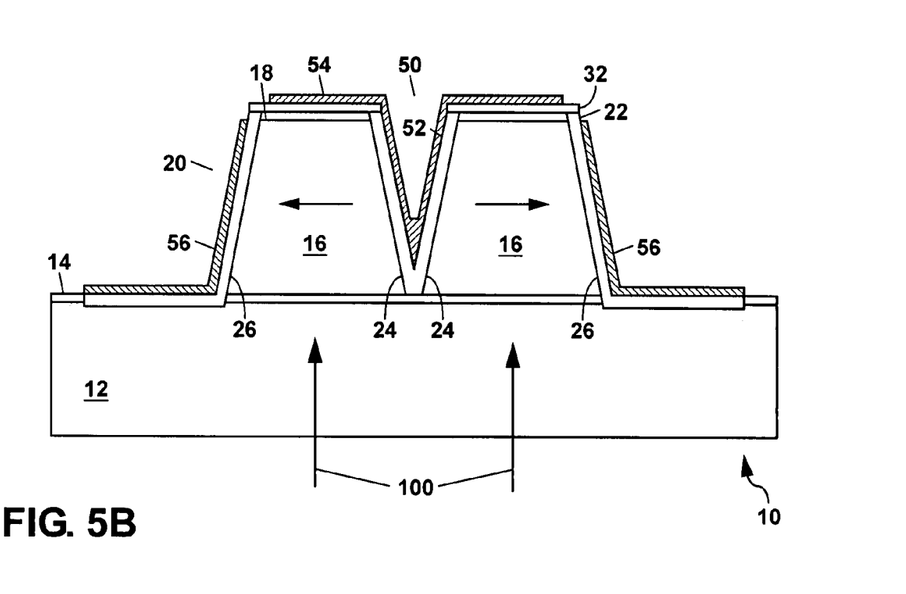
FIG. 5B shows a schematic cross-section view of the device of FIG. 5A along the section line 5-5 in FIG. 5A.

FIG. 5A shows a schematic plan view of a fourth example of the photodetector 10 of the present invention; and FIG. 5B shows a schematic cross-section view of this device 10 taken along the section line 5-5 in FIG. 5A. In the example of FIGS. 5A and 5B, the plurality of semiconductor layers can be epitaxially grown upon a semiconductor substrate 12 as previously described with reference to FIGS. 1A and 1B, with the semiconductor layers comprising a lower cladding layer 14, a type-II superlattice region 16, and an upper cladding layer 18.

After growth of the semiconductor layers, a mesa structure 20 can be formed by etching down through the semiconductor layers. In this example of the present invention, the mesa structure 20 comprises a plurality of outer sidewalls 22, but also includes a central portion 50 which is etched down at least partway through the superlattice region 16 to form one or more inner sidewalls 52. The central portion 50 can be etched at the same time the outer sidewalls 22 of the mesa structure 20 are etched (e.g. using a chemically-assisted ion beam etching step), or can be formed by a separate etching step. The central portion 50 can be sloped inward with distance from a top surface of the mesa structure 20 as shown in FIG. 5B. The central portion 50 can have an inverted conical shape as shown in FIGS. 5A and 5B, or can have an inverted pyramid shape. In other embodiments of the present invention, the central portion 50 can have one or more inner sidewalls 22 which are oriented substantially perpendicular to the substrate 12.

In the example of FIGS. 5A and 5B, a first impurity-doped region (e.g. an n-type-doped region 24) can be formed on the inner sidewall 52 of the inverted-conical-shaped central portion 50 by ion implanting or thermally diffusing a dopant species (e.g. Te for n-type doping or Be for p-type doping) into the type-II superlattice region 16 from the inner sidewall 52. An opposite dopant species can then be ion implanted or thermally diffused into the outer sidewalls 22 of the mesa structure 20 to form a second impurity-doped region (e.g. a p-type doped region 26). The second impurity-doped region can also extend down through the lower cladding layer 14 as shown in FIG. 5B to provide an electrical connection to the semiconductor substrate 12.

In the example of FIGS. 5A and 5B, a first electrode 54 can be deposited over the inner sidewall 52 of the mesa structure 20 and can also extend overtop the mesa structure 20 above an electrically-insulating layer 32. A second electrode 56 can be deposited on the outer sidewalls 22 to wrap around the mesa structure 20. The electrodes 54 and 56 can comprise, for example, Ti/Pt/Au electrodes as described previously with an overall thickness of about 200 nm.

In this example of the photodetector 10 of the present invention, the etched central portion 50 of the mesa structure 20 allows the formation of the first impurity-doped region (i.e. region 24 in FIGS. 5A and 5B) in the center of the photodetector 10. This is useful to reduce the width of the depletion region of the semiconductor junction formed between the impurity-doped regions 24 and 26. The smaller depletion width is advantageous since it provides an increased response time and an increased output signal for the photodetector 10 of FIGS. 5A and 5B.

In the example of FIGS. 5A and 5B, the semiconductor substrate 12 can be a GaSb or GaAs substrate; the cladding layers 14 and 18 can comprise GaSb, InAs, AlGaSb or AlGaAsSb; and the type-II superlattice region 16 can comprise a plurality of alternating layers of InAs and $In_xGa_{1-x}Sb$ with $0 \leq x \leq 0.5$. The layer thicknesses and indium content x in the superlattice region 16 can be adjusted during epitaxial growth by MBE for absorption of the light 100 over a predetermined wavelength band in the wavelength range of 3-25 µm.

Figure 6:
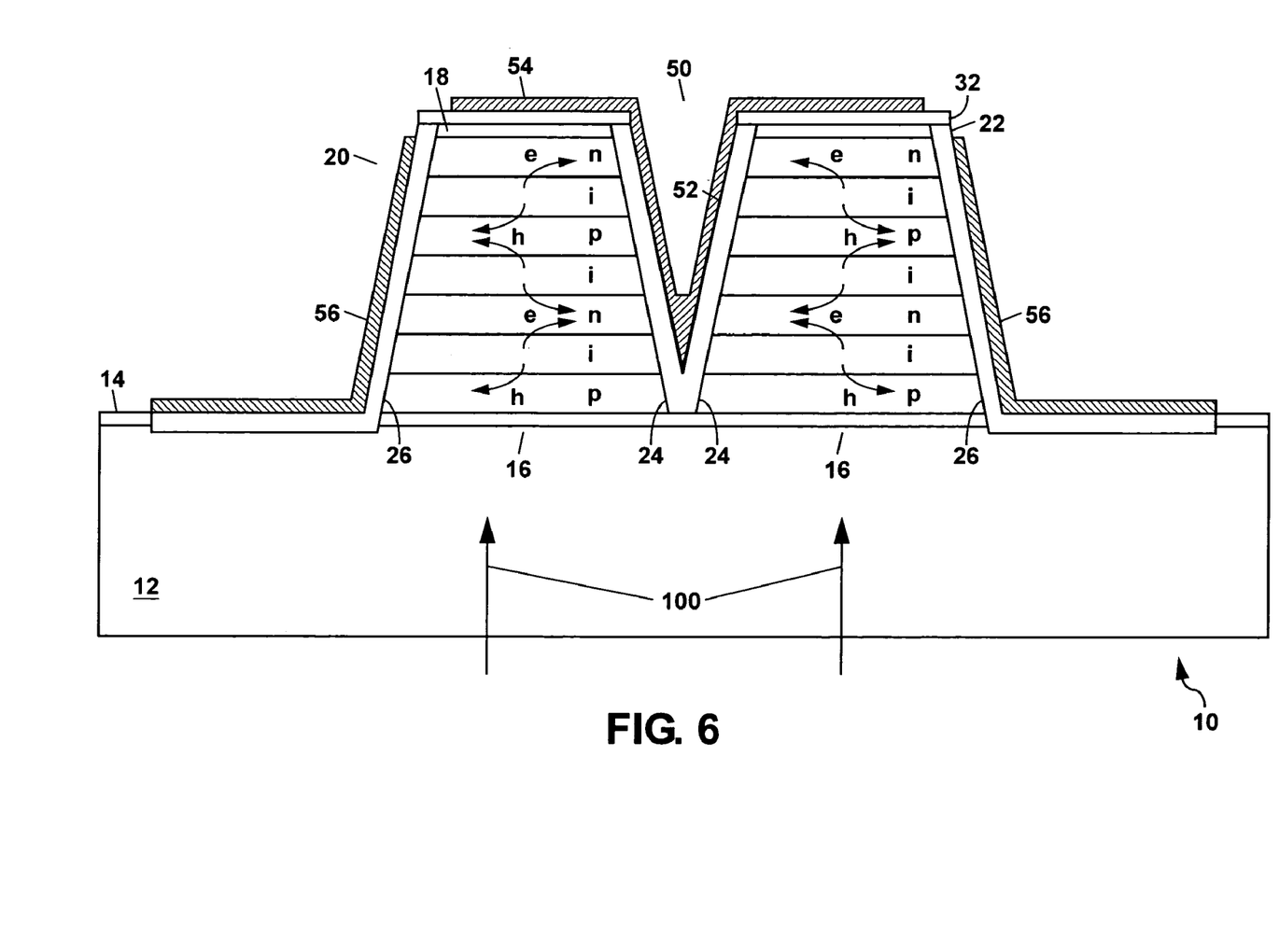
FIG. 6 shows an alternative doping arrangement for the type-II superlattice region in the photodetector of FIGS. 5A and 5B.

In the example of FIGS. 5A and 5B, the type-II superlattice region 16 can be epitaxially grown not-intentionally-doped (i.e. with a residual doping level on the order of $10^{16}$ cm$^{-3}$ or less). An alternative doping arrangement for the photodetector 10 of FIGS. 5A and 5B is schematically illustrated in the cross-section view of FIG. 6. In the example of FIG. 6, the type-II superlattice region 16 can be epitaxially grown with a number of not-intentionally-doped superlattice regions (indicated by the label "i") sandwiched between n-type-doped superlattice regions (indicated by the label "n") and p-type-doped superlattice regions (indicated by the label "p"). The n-type-doped superlattice regions can provide an enhanced in-plane mobility for photo-generated electrons (indicated by the label "e" in FIG. 6) which are swept out of the depleted intrinsic region and into the adjacent n-type-doped superlattice regions and therefrom to the electrode 54. The path of the photo-generated electrons is schematically illustrated by the curved arrows next to the label "e". Similarly, the p-type-doped superlattice regions provide an enhanced in-plane mobility for photo-generated holes (indicated by the label "h") which are swept out of each depleted intrinsic region and into the p-type-doped superlattice regions and therefrom to the electrode 56 as indicated by the curved arrows next to the label "h" in FIG. 6.

The alternating arrangement of the n-type-doped and p-type-doped superlattice regions in FIG. 6 also impedes any vertical movement of the photo-generated electrons and holes beyond the nearest n-type-doped or p-type-doped superlattice region. This helps to reduce carrier recombination to improve the detectivity of the photodetector 10 in FIG. 6. Each n-type-doped, p-type-doped, and not-intentionally-doped superlattice region in FIG. 6 will comprise a plurality of alternating InAs and $In_xGa_{1-x}Sb$ superlattice layers and can have a thickness which can be up to a few microns.

The superlattice region 16 in the example of FIG. 6 can also be used to form a multi-color photodetector 10 which simultaneously detects light 100 in two different wavelength bands. This can be done by making the intrinsic superlattice regions responsive to light 100 in one wavelength band (e.g. 8-12 µm) and making the n-type-doped and p-type-doped superlattice regions responsive to light 100 in another wavelength band (e.g. 3-5 µm). The cut-off wavelength for the light 100 in each superlattice region can be selected by controlling the bandgap energy in that region during epitaxial growth.

Figure 7A:
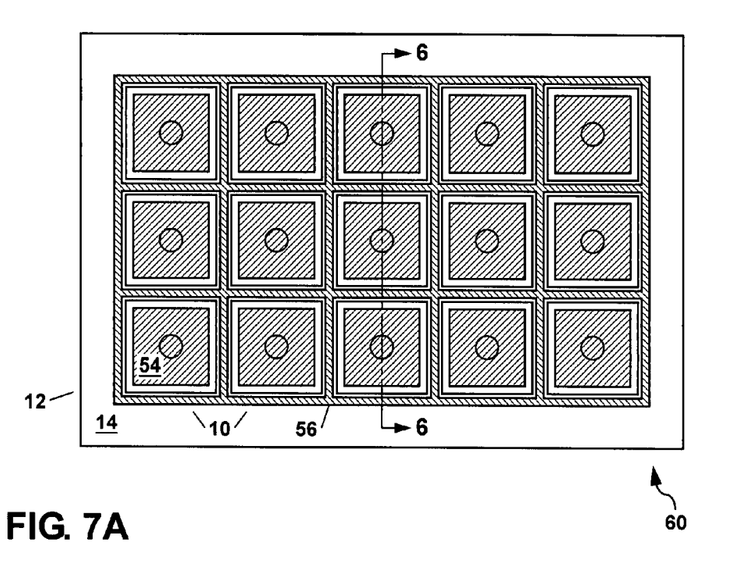
FIG. 7A shows a schematic plan view of an example of a 2-D photodetector array formed according to the present invention.
Figure 7B:
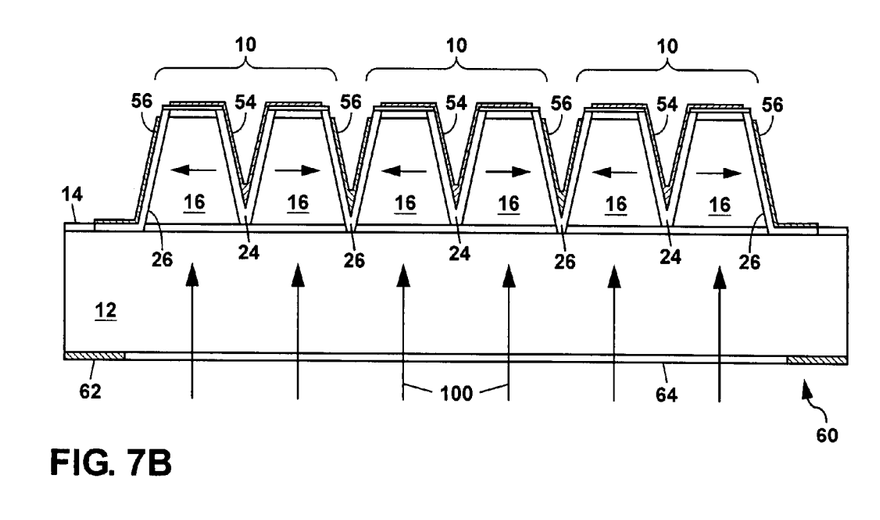
FIG. 7B shows a schematic cross-section of the 2-D photodetector array of FIG. 6A along the section line 6-6 in FIG. 7A.

Each of the photodetectors 10 described herein can also be used to form a 2-D array of photodetectors. FIGS. 7A and 7B show an example of a 2-D photodetector array 60 utilizing photodetectors 10 according to FIGS. 5A and 5B. In this 2-D photodetector array 60, only a relatively small number of photodetectors 10 are shown. Those skilled in the art will understand that the 2-D photodetector array 60 can comprise up to millions or more individual photodetectors 10 each having lateral dimensions of generally 5-50 µm. Such a 2-D photodetector array 60 is useful for imaging applications.

In the example of FIGS. 7A and 7B, the electrodes 56 surrounding each photodetector 10 can be electrically connected together and can further be connected to the substrate 12. This provides a common electrical connection for the 2-D photodetector array 60. The substrate 12 can also include an optional bottom contact 62. The electrodes 54 formed overtop the mesa structure 20 of each photodetector 10 provide an independent electrical contact to each photodetector 10 in the 2-D array 60. For infrared imaging applications, the semiconductor substrate 12 can comprise GaSb or GaAs, and the plurality of semiconductor layers can be as previously described with reference to FIGS. 5A and 5B.

Incident light 100 at infrared wavelengths can be imaged onto the 2-D photodetector array 60 using an optical element (e.g. a lens or mirror). The substrate 12 can be thinned down to a thickness of less than 200 µm, and in some instances down to about 20-30 µm depending upon the exact wavelengths of the light 100 being detected with the 2-D array 60. Thinning of the substrate 12 improves the transmission of infrared light 100 into the photodetectors 10 in the 2-D array 60. An anti-reflection coating 64 can also be applied to a bottom side of the substrate 12 to further improve the transmission of the incident light 100 through the substrate 12.

Figure 8:
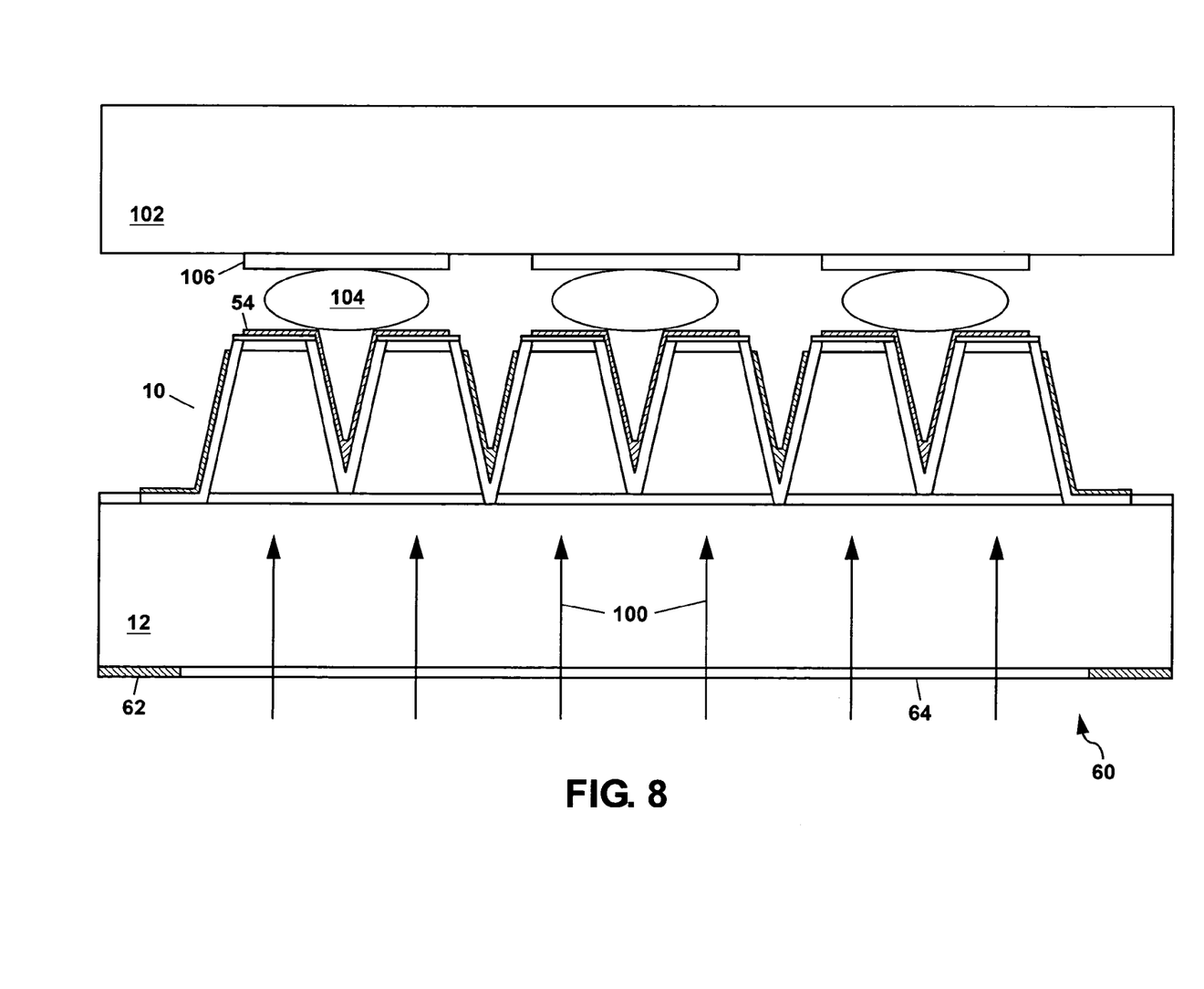
FIG. 8 shows a schematic cross-section view to illustrate how the 2-D array of FIG. 7A can be attached to a readout integrated circuit (ROIC) using a plurality of solder bump interconnects.

After fabrication, the 2-D photodetector array 60 can be mated to a conventional readout integrated circuit (ROIC) 102 which contains circuitry to address and read out the individual photodetectors 10 in the 2-D array 60. This is schematically illustrated in the cross-section view of FIG. 8. The ROIC 102 can be, for example, a complementary metal-oxide semiconductor (CMOS) integrated circuit (IC) which can be procured commercially, or custom designed for the 2-D photodetector array 60. The ROIC 102 can be used to readout current signals which are generated by each photodetector 10 in response to detection of the incident light 100. Additional functionality can be provided in the ROIC 102 including signal amplification, signal averaging, background compensation, calibration, data storage, serial or parallel data readout, etc. The attachment of the 2-D photodetector array 60 to the ROIC 102 can be performed using conventional flip-chip solder bump technology which uses a plurality of-solder bump interconnects 104 (e.g. comprising an indium solder) which are provided between the electrodes 54 and electrodes 106 on the ROIC 102 to attach the 2-D photodetector array 60 to the ROIC 102. The completed assembly in FIG. 8 can then be packaged for use.

Although the various photodetectors 10 herein have been described as photodiodes with a semiconductor p-n or p-i-n junction, each photodetector 10 can also be formed as a photoconductor. This can be done by using a single doping type (e.g. n-type doping or p-type doping) for each impurity-doped region. Preferably, this single doping type is the same as the residual (i.e. not intentional) doping in the superlattice region 16. When each photodetector 10 is formed as a photoconductor, the absorption of the incident light 100 in the superlattice region 16 will generate carriers which will change the electrical conductivity of the superlattice region 16. This change in electrical conductivity can then be sensed to detect the light 100.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A photodetector for detecting infrared light, comprising:
    a semiconductor substrate;
    a plurality of semiconductor layers epitaxially grown on the semiconductor substrate, with the plurality of semiconductor layers including a lower cladding layer, a type-II superlattice region, and an upper cladding layer;
    a mesa structure formed from the plurality of semiconductor layers, with the mesa structure having a plurality of outer sidewalls, and with the mesa structure having a central portion in the center of the photodetector which is etched downward at least partway through the type-II superlattice region to form an inner sidewall of the mesa structure;

an electrically-insulating layer deposited over a top surface of the mesa structure;

a first impurity-doped region extending into the mesa structure from the inner sidewall of the mesa structure;

a second impurity-doped region extending into the mesa structure from at least one of the outer sidewalls of the mesa structure;

a first electrode deposited over the inner sidewall of the mesa structure and extending over the top surface of the mesa structure above the electrically-insulating layer; and a second electrode deposited over the second impurity-doped region.

2. The apparatus of claim 1 wherein the semiconductor substrate comprises a gallium antimonide (GaSb) substrate, or a gallium arsenide (GaAs) substrate.

3. The apparatus of claim 1 wherein the lower cladding layer and the upper cladding layer each have a bandgap energy which is larger than the bandgap energy of the type-II superlattice region.

4. The apparatus of claim 1 wherein the type-II superlattice region comprises a not intentionally doped type-II superlattice.

5. The apparatus of claim 1 wherein the type-II superlattice region comprises a plurality of alternating layers of indium arsenide (InAs) and indium gallium antimonide ($In_xGa_{1-x}Sb$) with an indium content x in the range $0 \leq x \leq 0.5$.

6. The apparatus of claim 1 wherein the inner sidewall of the mesa structure is tapered inward with distance from the top surface of the mesa structure.

7. The apparatus of claim 1 wherein the central portion of the mesa structure has a conical shape, or a pyramidal shape.

8. The apparatus of claim 1 wherein the outer sidewalls of the mesa structure are tapered outward with distance from the top surface of the mesa structure.

9. The apparatus of claim 1 wherein the first impurity-doped region and the second impurity-doped region are oppositely doped.

10. The apparatus of claim 1 wherein the second impurity-doped region extends into the mesa structure from each outer sidewall of the mesa structure.

11. The apparatus of claim 1 wherein the second electrode is in electrical contact with the semiconductor substrate.

12. A two-dimensional (2-D) array of photodetectors for detecting infrared light, comprising:

a III-V compound semiconductor substrate;

a plurality of III-V compound semiconductor layers epitaxially grown on the III-V compound semiconductor substrate including n type-II superlattice region formed from alternating layers of indium arsenide (InAs) and indium gallium antimonide ($In_xGa_{1-x}Sb$) with an indium content given by $0 \leq x \leq 0.5$;

a mesa structure formed from the plurality of III-V compound semiconductor layers at the location of each photo detector in the 2-D array of photodetectors, with the mesa structure having at least one outer sidewall, and with a central portion of the mesa structure in the center of each photodetector being etched downward at least partially through the type-II superlattice region to form an inner sidewall of the mesa structure;

an electrically-insulating layer deposited over a top surface of each mesa structure;

a first impurity-doped region extending into each mesa structure from the inner sidewall thereof;

a second impurity-duped region extending into each mesa structure from the at least one outer sidewall thereof;

a first electrode deposited over the inner sidewall of each mesa structure and extending over the top surface the mesa structure above the electrically-insulating layer; and a second electrode deposited over the second impurity-doped region of each mesa structure.

13. The apparatus of claim 12 wherein the III-V compound semiconductor substrate comprises a gallium arsenide (GaAs) substrate, or a gallium antimonide (GaSb) substrate.

14. The apparatus of claim 12 wherein the plurality of III-V compound semiconductor layers includes a lower cladding layer located beneath the type-II superlattice region, and an upper cladding layer located above the type-II superlattice region.

15. The apparatus of claim 12 wherein the first impurity-doped region and the second impurity-doped region are oppositely doped.

16. The apparatus of claim 12 wherein the type-II superlattice region comprises a not-intentionally-doped type-II superlattice.

17. The apparatus of claim 12 wherein the second electrode of each mesa structure is electrically connected to the III-V compound semiconductor substrate.

* * * * *